United States Patent
Li et al.

(10) Patent No.: US 7,411,424 B2
(45) Date of Patent: Aug. 12, 2008

(54) PROGRAMMABLE LOGIC FUNCTION GENERATOR USING NON-VOLATILE PROGRAMMABLE MEMORY SWITCHES

(75) Inventors: Donghui Li, Palo Alto, CA (US); Jack Zezhong Peng, San Jose, CA (US); Jason Chen, Santa Clara, CA (US)

(73) Assignee: KLP International, Ltd., Santa Clara, CA (US)

( * ) Notice: Subject to any disclaimer, the term of this patent is extended or adjusted under 35 U.S.C. 154(b) by 105 days.

(21) Appl. No.: 11/400,924

(22) Filed: Apr. 10, 2006

(65) Prior Publication Data

US 2007/0176644 A1 Aug. 2, 2007

Related U.S. Application Data

(60) Provisional application No. 60/763,039, filed on Jan. 27, 2006.

(51) Int. Cl.
*H03K 19/20* (2006.01)

(52) U.S. Cl. ............................ 326/113; 326/38; 326/106

(58) Field of Classification Search .................. 326/38, 326/39, 113
See application file for complete search history.

(56) References Cited

U.S. PATENT DOCUMENTS

| | | | | |
|---|---|---|---|---|
| 5,973,507 A * | 10/1999 | Yamazaki | ..................... | 326/52 |
| 6,348,813 B1 * | 2/2002 | Agrawal et al. | ................ | 326/41 |
| 6,924,664 B2 * | 8/2005 | Wang | ........................... | 326/39 |
| 6,924,671 B2 * | 8/2005 | Mizuno | ...................... | 326/113 |
| 2003/0179623 A1 * | 9/2003 | Inoue | ......................... | 365/200 |
| 2003/0229837 A1 * | 12/2003 | Cox | ............................ | 714/737 |
| 2005/0035783 A1 * | 2/2005 | Wang | ........................... | 326/39 |

\* cited by examiner

*Primary Examiner*—Rexford Barnie
*Assistant Examiner*—Jany Tran
(74) *Attorney, Agent, or Firm*—Perkins Coie LLP

(57) ABSTRACT

Methods and apparatus are disclosed to implement programmable logic generators that provide the advantages of compatible look-up tables (LUTs) while utilizing less silicon real estate and power for the same number of functions. The disclosed methods and apparatus employ programmable switches to emulate memory units that are used in LUTs and illustrate construction of 2- and 3-input LUTs as building blocks of other multi-input LUTs.

24 Claims, 7 Drawing Sheets

| FUNCTION | SWITCH STATUS | | | | | | | | EQUATION |
|---|---|---|---|---|---|---|---|---|---|
| | S1 | S2 | S3 | S4 | S5 | S6 | S7 | S8 | |
| 0 | 1 | 0 | 1 | 0 | 1 | 0 | 1 | 0 | O = A * 0 + !A * 0 |
| 1 | 1 | 0 | 1 | 0 | 0 | 1 | 0 | 1 | O = A * 1 + !A * 1 |
| A | 1 | 0 | 1 | 0 | 1 | 0 | 0 | 1 | O = A * 1 + !A * 0 |
| B | 0 | 1 | 0 | 1 | 0 | 1 | 0 | 1 | O = A * B + !A * B |
| !A | 1 | 0 | 1 | 0 | 0 | 1 | 1 | 0 | O = A * 0 + !A * 1 |
| !B | 0 | 1 | 0 | 1 | 1 | 0 | 1 | 0 | O = A * !B + !A * !B |
| AB | 1 | 0 | 0 | 1 | 1 | 0 | 0 | 1 | O = A * B + !A * 0 |
| A(!B) | 1 | 0 | 0 | 1 | 1 | 0 | 1 | 0 | O = A * !B + !A * 0 |
| (!A)B | 0 | 1 | 1 | 0 | 0 | 1 | 1 | 0 | O = A * 0 + !A * B |
| (!A)(!B) | 0 | 1 | 1 | 0 | 1 | 0 | 1 | 0 | O = A * 0 + !A * !B |
| A + B | 0 | 1 | 1 | 0 | 0 | 1 | 0 | 1 | O = A * 1 + !A * B |
| A + !B | 0 | 1 | 1 | 0 | 1 | 0 | 0 | 1 | O = A * 1 + !A * !B |
| !A + B | 1 | 0 | 0 | 1 | 0 | 1 | 0 | 1 | O = A * B + !A * 1 |
| !A + !B | 1 | 0 | 0 | 1 | 0 | 1 | 1 | 0 | O = A * !B + !A * 1 |
| A(!B) + (!A)B | 0 | 1 | 0 | 1 | 0 | 1 | 1 | 0 | O = A * !B + !A * B |
| AB + (!A)(!B) | 0 | 1 | 0 | 1 | 1 | 0 | 0 | 1 | O = A * B + !A * !B |
| | 0 = SWITCH OFF / 1 = SWITCH ON | | | | | | | | |

FIGURE 6

PROGRAMMABLE LOGIC FUNCTION GENERATOR USING NON-VOLATILE PROGRAMMABLE MEMORY SWITCHES

CROSS-REFERENCE TO RELATED APPLICATION(S)

This application claims the benefit of provisional U.S. Patent Application No. 60/763,039, filed Jan. 27, 2006, which is hereby incorporated by reference in its entirety.

TECHNICAL FIELD

The embodiments of the invention relate, in general, to logic function generation devices and, in particular, to programmable logic devices and field-programmable gate arrays.

BACKGROUND

Integrated circuit (IC) technology is often used to implement logic functions. Some ICs provide combinationatorial and sequential logic functions that are user-programmable. One class of such ICs uses programmable logic gates to implement desired functions and to drive the output. Another class of these ICs employs memory units, each of which utilizes the input signals as its memory address and outputs its stored content as the desired functional combination of the address bits. These devices are generally known as programmable logic devices (PLDs). Different methods of implementing PLDs abound in the literature of this field.

One type of PLD is known as a field programmable gate array (FPGA), which usually contains an array of modularized logic function generators and programmable interconnects. It is an array of uncommitted gates with uncommitted wiring channels. Each logic cell can be programmed to implement a particular logic function. A gate array circuit can be programmed to implement virtually any set of functions. FPGAs generally use look-up tables (LUTs) or universal logic modules (ULMs).

A look-up table is an addressable array or a matrix of memory units that contains data and can be searched by addressing and accessing individual memory units. Therefore, by programming predetermined values into the memory array, the LUT can implement any function of the input variables. FPGAs can be manufactured to allow a combination of LUTs to be grouped together to implement larger functions.

FIG. 1 shows a 2-input LUT according to the prior art. This LUT is disclosed in U.S. Pat. Nos. 4,642,487 and 4,870,302. The circuit contains four SRAM memory cells (M1 to M4), six NMOS pass gates n1-n6, and three inverters inv1-inv3. This implementation requires 24 NMOS and 6 PMOS devices. The NMOS pass gates cause a Vt drop, and thus, there is a need for a recovery circuit.

As process technology scales down to 0.13 micron, 90 nm, and beyond, the Vdd voltage is also scaled down to below 1.2V. Furthermore, the pass devices n1-n6 ineffectively pass Vdd due to the Vt drop of the NMOS. Thus, transmission gate devices are substituted by the ones shown in FIG. 2 (see also U.S. Pat. Nos. 5,719,507 and 6,809,552). However, this implementation also requires 24 NMOS and 16 PMOS devices, not including the buffer inverter inv3.

The prior art look-up tables, as illustrated above, use a relatively large number of devices, which result in LUTs that consume valuable silicon area. In addition, there is a high amount of power leakage, which may well become a serious limitation for FPGAs that are used in battery-operated applications.

DESCRIPTION OF THE DRAWINGS

The foregoing aspects and many of the attendant advantages of the invention will become more readily appreciated as the same become better understood by reference to the following detailed description, when taken in conjunction with the accompanying drawings, wherein:

FIG. 6 is a table of possible functions the logic generator of FIG. 3 can implement when switches S1-S8 are properly programmed.

DETAILED DESCRIPTION

Embodiments of the present invention relate to the general area of programmable logic devices (PLDs). In particular, they relate to the architecture of programmable logic generators which can form the building blocks of the field programmable gate arrays (FPGAs).

In the detailed description provided below, several different embodiments of a programmable logic generator are disclosed. Methods and apparatus are herein disclosed to implement programmable logic generators that emulate and provide the advantages of compatible look-up tables, while utilizing less silicon real estate and power. The disclosed methods and apparatus employ programmable switches to emulate memory units used in LUTs and illustrate construction of 2- and 3-input LUTs as building blocks of other multi-input LUTs.

A single 2-input programmable logic generator offers, among other advantages, easy implementation of 16 2-input logic functions. At the core of the described programmable logic generators are simple programmable switches. These switches, in combination, emulate addressable memory units, and their proper programming will generate an output that is a desired logical combination of the input bits. These switches can be constructed in several ways, a few of which are described as examples.

In the following description, several specific details are presented to provide a thorough understanding of the embodiments of the invention. One skilled in the relevant art will recognize, however, that the invention can be practiced without one or more of the specific details, or in combination with or with other components, etc. In other instances, well-known implementations or operations are not shown or described in detail to avoid obscuring aspects of various embodiments of the invention.

The terminology used in the description presented below is intended to be interpreted in its broadest reasonable manner, even though it is being used in conjunction with a detailed description of certain specific embodiments of the invention. Certain terms may even be emphasized below; however, any terminology intended to be interpreted in any restricted manner will be overtly and specifically defined as such in this Detailed Description section.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
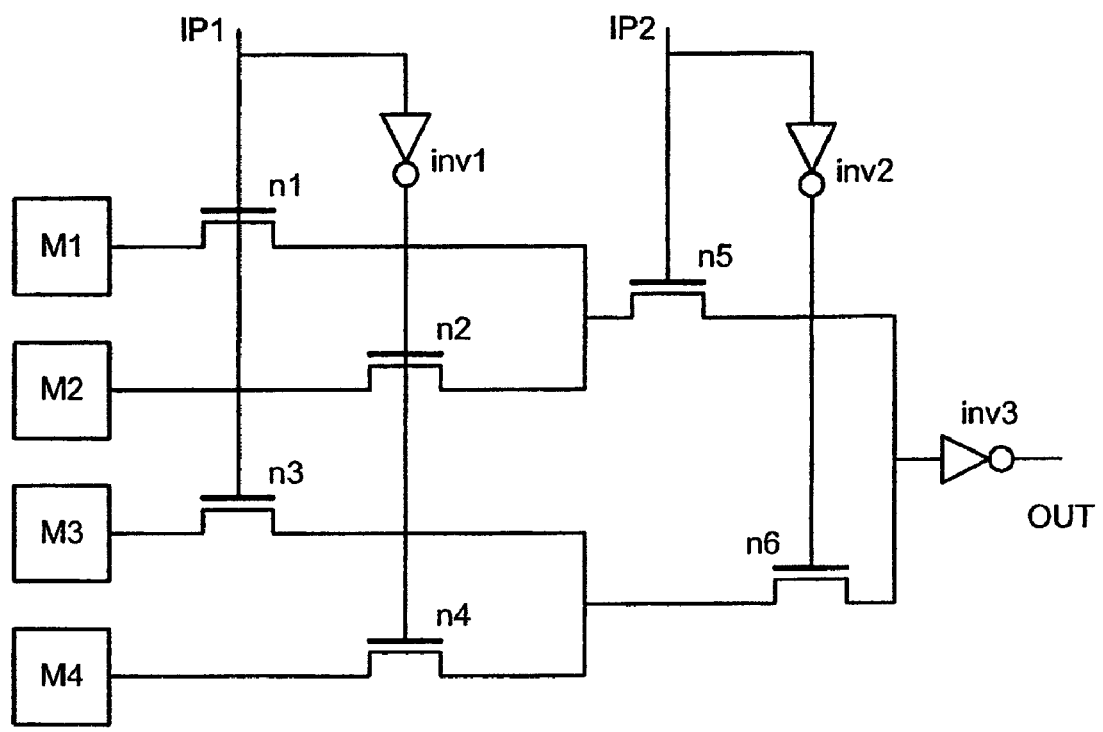
FIGS. 1 and 2 show examples of prior art 2-input look-up tables (LUT2).
Figure 2:
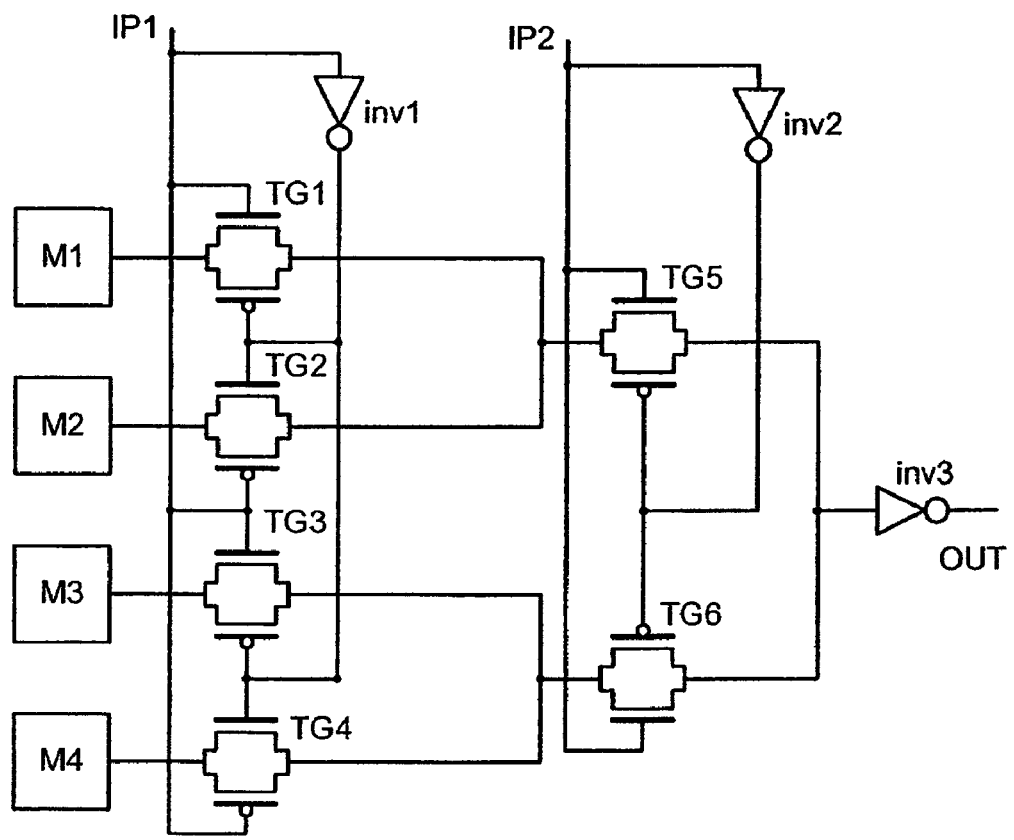
Figure 3:
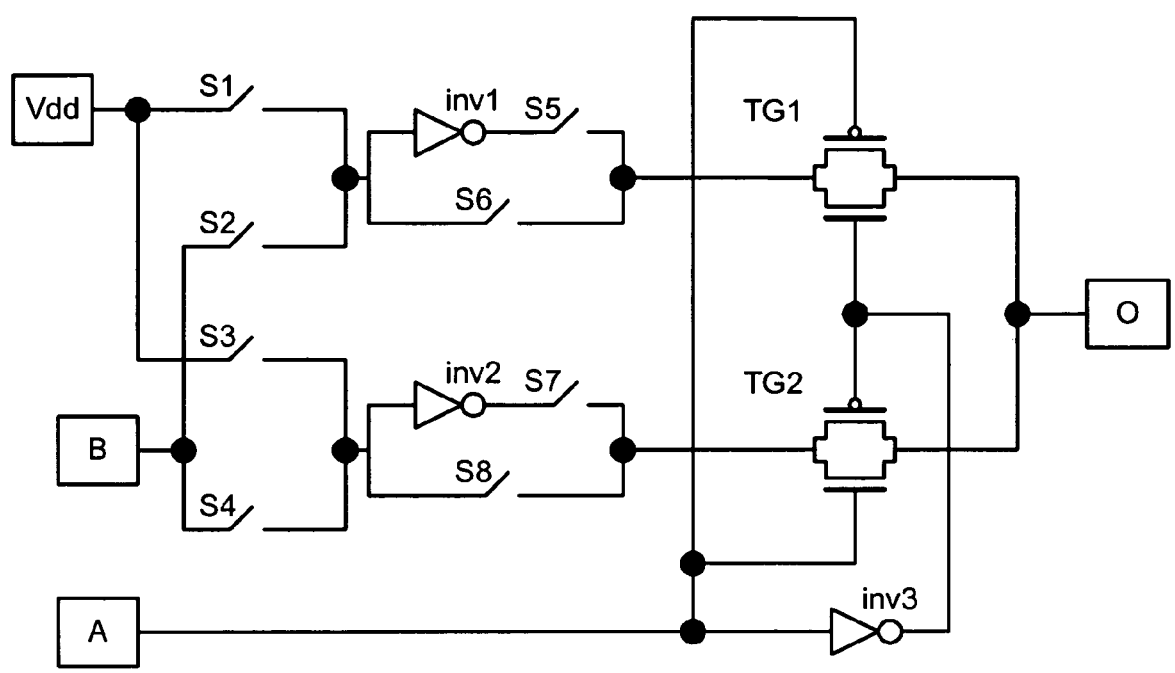
FIG. 3 illustrates a 2-input programmable logic generator that performs as a LUT2 in accordance with an embodiment of the invention.

FIG. 3 illustrates a 2-input programmable logic generator that can act as a LUT2, in accordance with an embodiment of the invention. As illustrated in FIG. 3, S1 to S8 are programmable switches that can be implemented using different memory technologies. In this embodiment a signal at an input A controls both transmission gates TG1 and TG2. Any signal that has originated either from Vdd or from an input B and has passed through some of the closed switches to arrive at TG1 or TG2 can be routed to an output O by the input signal A. To open and close transmission gates TG1 and TG2, the input signal A and its inverse, which is produced by an inv3, are both utilized.

The circuit arrangement of FIG. 3, along with proper setting of switches S1 to S8, can generate 16 logic functions of the two input signals A and B. Two inverters inv1 and inv2, depicted in FIG. 3, are used to invert the signals when a logic function requires inversion of a signal. FIG. 6 illustrates the mentioned 16 logic functions and the exemplary switch settings of the function generator of FIG. 3 to implement these functions.

Figure 4:
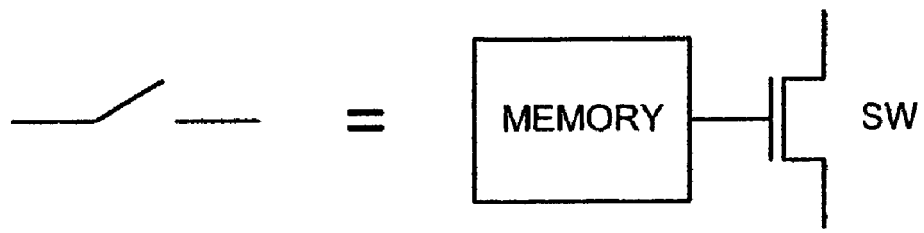
FIGS. 4 and 5 depict implementation details of a programmable switch shown in FIG. 3 in accordance with other embodiments of the invention.

In one embodiment, illustrated in FIG. 4, S1 through S8 are programmable NMOS pass devices with higher gate voltages provided by programmable memories. Such arrangement significantly reduces the number of transmission gates.

In another embodiment, the memory that drives the gate of the NMOS switch in FIG. 4 can be implemented using the XPM technology ("super programmable memory," based on oxide breakdown for non-volatile and dynamic memories). Examples of this technology are described in U.S. Pat. Nos. 6,972,986, 6,940,751, 6,822,888, and 6,667,902 to Jack Zezhong Peng ("Peng," the present inventor), which are hereby incorporated by reference in their entirety. This programmable memory can be implemented in other ways as well, such as volatile memories like SRAM and non-volatile memories or combined volatile and non-volatile memories (e.g., U.S. Pat. Nos. 6,650,143, 6,972,986, and U.S. Provisional Patent Application No. 60/749,551).

Figure 5:
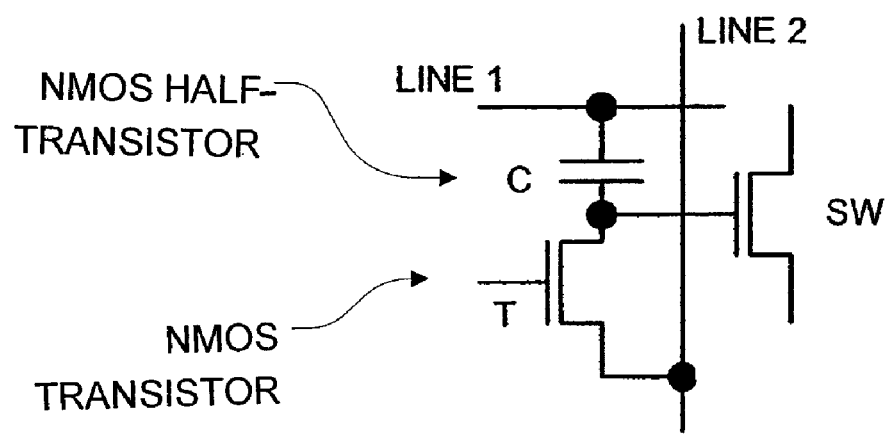

FIG. 5 shows an implementation using a one-time programmable (OTP) memory described in U.S. Pat. No. 6,667,902 to Peng. A capacitor C in FIG. 5 can be a half-transistor wherein the gate and the drain or source of an NMOS transistor, which is separated by the oxide, form a capacitor. Peng discloses a non-volatile OTP memory unit as one NMOS transistor T in series with a half-transistor C at the cross-point of a line1 and a line2. The transistor T is also used to "select" a particular memory cell for programming.

To apply a ground (GND) voltage to the gate of a switch SW to keep it "open," the transistor T is turned ON while the line2 is connected to the GND. To apply a voltage Vcc to the gate of the switch SW to keep it "closed," the capacitor C is first broken down and then the line1 is connected to a Vcc, while the transistor T is OFF. Breaking down or "programming" the capacitor C is implemented by turning ON the transistor T and applying an appropriately high voltage to line1 for a predetermined duration of time. In this way, the capacitor C can act as a non-volatile programmable memory unit that keeps the switch SW open or closed.

Since the voltage on the gate of the switch SW should be higher than Vcc+Vt, the implementation of the programmable switch uses devices with higher operation voltages than 1.5V (or 1.8V) and the logic device operation voltage (i.e., 1.0V or 1.2V for 90 nm and 0.13 um). This enables the use of a single NMOS pass gate instead of CMOS transmission gates.

If the memory cell shown in FIG. 6 is counted as two NMOS devices, then the full LUT2 function generator shown in FIG. 3 requires only 29 NMOS and 5 PMOS devices, compared with the 24 NMOS and 16 PMOS devices of the prior art. Because PMOS devices usually take much more area than NMOS devices, the embodiment shown in FIG. 3 significantly reduces the device area.

However, in the embodiment shown in FIG. 3, if S1 and S2 or S3 and S4 are open (e.g., when the function generator is not in use), the input of inverter inv1 or inv2, respectively, will be floating and may cause leakage. In order to prevent such leakage, three methods are disclosed below:

Method 1: Use virtual ground on the inverters, i.e., let the original Vss float or be biased to Vcc to prevent leakage-current between Vcc and the ground.

Method 2: Turn off the Vcc power supply to the function generator.

Figure 7:
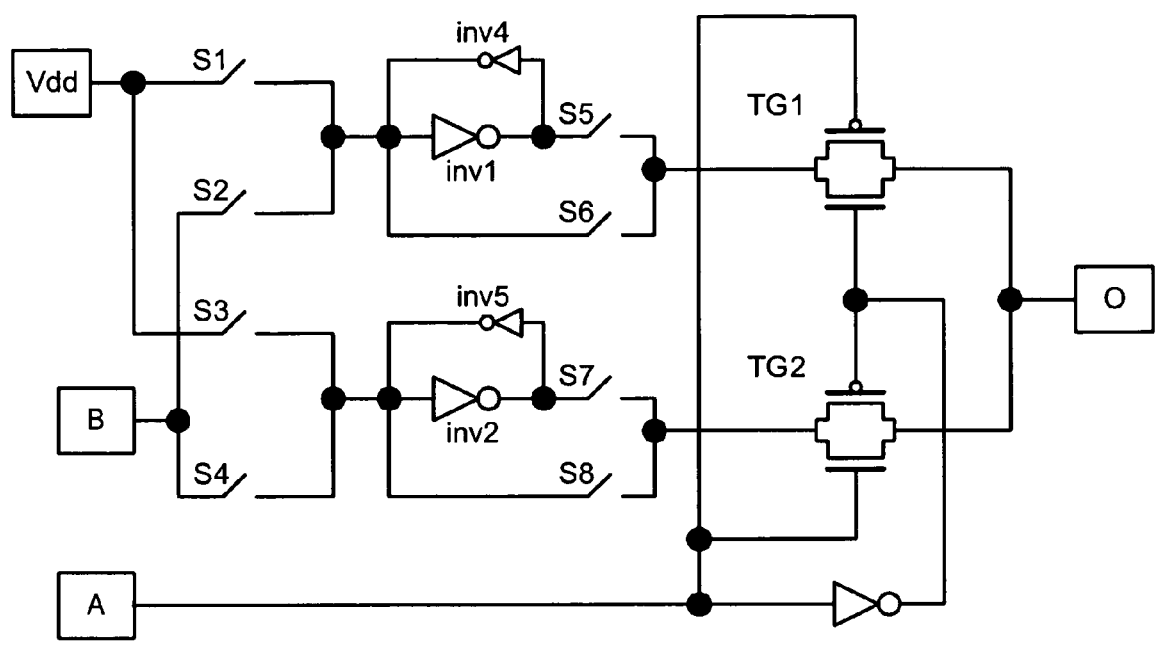
FIG. 7 illustrates a 2-input programmable logic generator that can act as a LUT2 and prevent leakage in accordance with an alternative embodiment of the invention.

Method 3: Add a small inverter inv4 and inv5 to the inv1 and the inv2, as illustrated in FIG. 7, to convert the inv1 and the inv2 to weak data latches.

Figure 8:
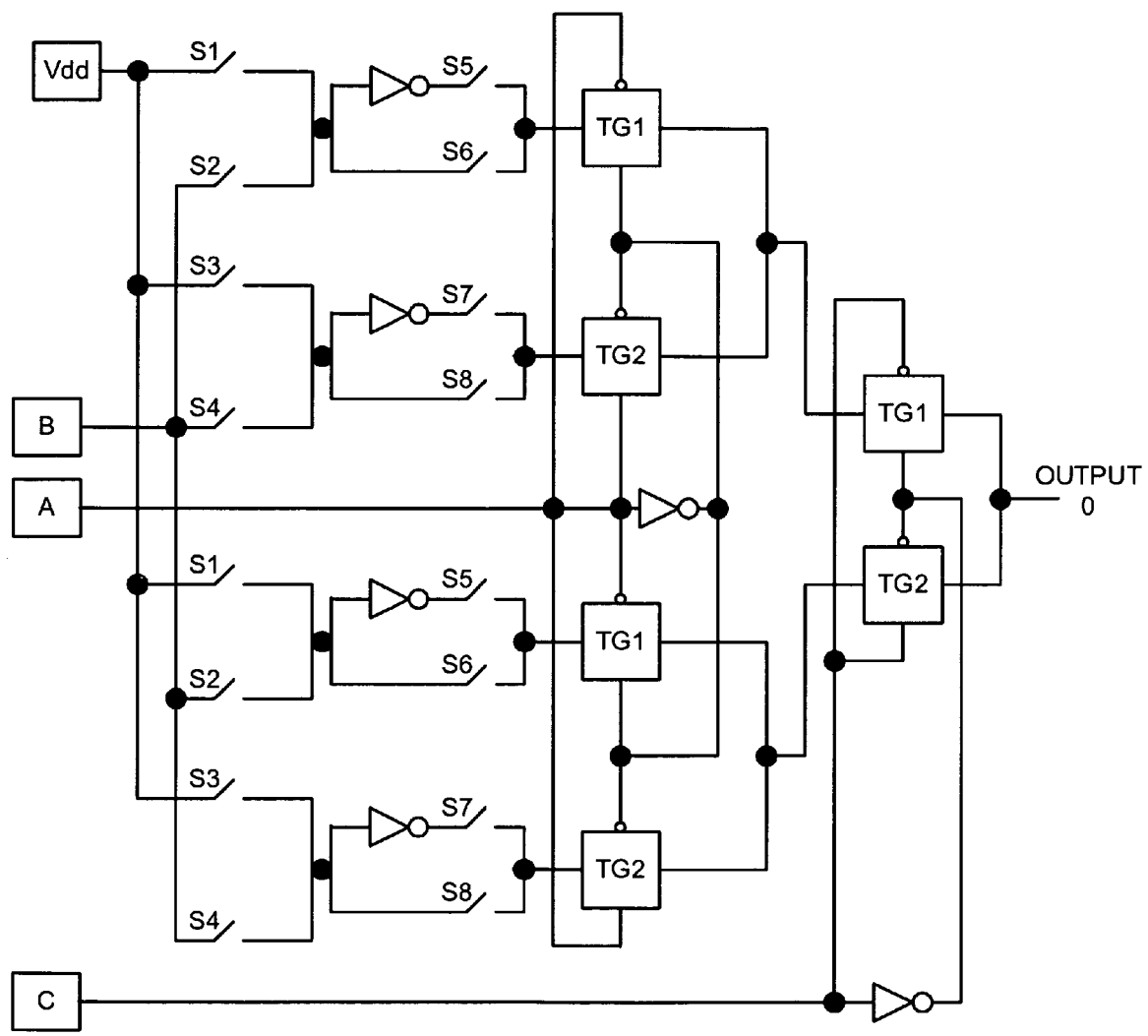
FIG. 8 illustrates a combination of two 2-input programmable logic generators to create a 3-input programmable logic generator (LUT3) in accordance with yet another embodiment of the invention.

FIG. 8 illustrates the construction of a fully functional 3-input LUT (LUT3) by combining two LUT2s. As can be seen from FIG. 8, only two additional pass gates or transmission gates are required for the construction of a LUT3.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. When the claims use the word "or" in reference to a list of two or more items, that word covers all of the following interpretations of the word: any of the items in the list, all of the items in the list, and any combination of the items in the list.

The above Detailed Description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. Also, the teachings of the invention provided herein can be applied to other systems, not necessarily the system described above. The elements and acts of the various embodiments described above can be combined to provide further embodiments.

All of the above patents and applications and other references, including any that may be listed in accompanying filing papers, are incorporated herein by reference. Aspects of the invention can be modified, if necessary, to employ the systems, functions, and concepts of the various references described above to provide yet further embodiments of the invention.

Changes can be made to the invention in light of the above "Detailed Description." While the above description details certain embodiments of the invention and describes the best mode contemplated, no matter how detailed the above appears in text, the invention can be practiced in many ways. Therefore, implementation details may vary considerably while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific embodiments disclosed in the specification, unless the above Detailed Description section explicitly defines such terms. Accordingly, the actual scope of the invention encompasses not only the disclosed embodiments, but also all equivalent ways of practicing or implementing the invention under the claims. For example, the invention is not limited to the embodiments herein.

While certain aspects of the invention are presented below in certain claim forms, the inventors contemplate the various aspects of the invention in any number of claim forms. Accordingly, the inventors reserve the right to add additional claims after filing the application to pursue such additional claim forms for other aspects of the invention.

We claim:

1. A 2-input programmable logic generator (PLG) to perform as a 2-input look-up table with minimum number of PMOS transistors, the PLG comprising:
    pass gates for routing signals to an output of the PLG, wherein the pass gates are controlled by a first input to the PLG;
    programmable switches for routing a second input signal and a high-logic voltage to the pass gates, wherein the switches are NMOS transistors, gates of which are controlled by programmable memory units; and
    inverters for inverting signals;
    wherein the second input, the high-logic voltage, or their inverses are programmably routed to each of the pass gates;
    and wherein:
    the second input and the high-logic voltage are connected to a first node through a first and a second programmable switch, respectively, and wherein the first node is connected to a first pass gate through a third switch and also connected through a series combination of a first inverter and a forth switch; and
    the second input and the high-logic voltage are connected to a second node through a fifth and a sixth switch, respectively, and wherein the second node is connected to a second pass gate through a seventh switch and also connected through a series combination of a second inverter and an eight switch.

2. The PLG of claim 1, wherein each programmable memory unit is composed of one NMOS half-transistor and one NMOS transistor.

3. The PLG of claim 1, wherein pass gates are transmission gates, NMOS transistors, or PMOS transistors.

4. The PLG of claim 1, wherein each switch is a MOS transistor the gate of which is controlled by an SRAM, a Flash memory, or a dynamic memory.

5. The PLG of claim 1, wherein following implementations prevent leakage when inputs to the first or the second inverter is floating:
    using virtual ground on the inverters, i.e. to let an original Vss float or be biased to Vcc;
    turning off power to the PLG; or
    adding a small inverter to each of the first and the second inverters to convert the first and the second inverters to weak data latches.

6. The PLG of claim 1, wherein the switches comprise at least four switches that are configurable to generate up to 16 logic functions via the two inputs.

7. A 2-input programmable logic generator (PLG), comprising:
    inverting means for inverting signals;
    transmitting means for controllably routing signals to an output of the PLG, wherein a first input signal to the PLG controls the transmitting means; and
    switching means for routing a second input signal, a voltage Vdd, or their inverses to the transmitting means; the switching means comprise at least four switches that are configurable to generate up to 16 logic functions via the two inputs; and
    wherein the following implementations prevent leakage when inputs to a first or a second inverting means are floating:
    using virtual ground on the inverting means by letting an original Vss float or be biased to Vcc;
    turning off power to the PLG; or
    adding a small inverter to each of the first and the second inverting means to convert the first and the second inverting means to weak data latches.

8. The PLG of claim 7, wherein each transmitting means is a transmission gate, an NMOS transistor, or a PMOS transistor.

9. The PLG of claim 7, wherein the switching means are controlled by programmable memory cells, SRAMs, non-volatile memory units, dynamic memories, or by XPMs (super programmable memories).

10. The PLG of claim 7, wherein two PLGs and two additional pass gates form a 3-input PLG.

11. A 2-input programmable logic generator (PLG), comprising:
    two pass gates for routing signals to an output of the PLG;
    eight programmable switches for routing signals to the pass gates;
    three inverters for inverting signals; and
    a configuration wherein:
        a first input to the PLG and a voltage Vdd are connected to a first node through a first and a second switch, respectively, and wherein the first node is connected to a first pass gate through a third switch and also connected through a series combination of a first inverter and a fourth switch;
        the first input to the PLG and the Vdd are connected to a second node through a fifth and a sixth switch, respectively, and wherein the second node is connected to a second pass gate through a seventh switch and also connected through a series combination of a second inverter and an eight switch;
        the pass gates are controlled by a combination of a second input signal to the PLG, its inverse, or both, wherein the inverse is produced by a third inverter; and
        programming of the first through the eighth switches routes the first input, the Vdd, or their inverses to the first pass gate, the second pass gate, or both, from which they are controllably routed to the PLG output.

12. The PLG of claim 11, wherein pass gates are transmission gates, NMOS transistors, or PMOS transistors.

13. The PLG of claim 11, wherein each switch is an NMOS transistor.

14. The PLG of claim 11, wherein each switch is a MOS transistor the gate of which is controlled by an SRAM, a Flash memory, or a dynamic memory.

15. The PLG of claim 11, wherein each switch is a MOS transistor the gate of which is controlled by an XPM (super programmable memory).

16. The PLG of claim 11, wherein following implementations prevent leakage when inputs to the first or the second inverter are floating:
 using virtual ground on the inverters, i.e., to let an original Vss float or be biased to Vcc;
 turning off power to the PLG; or
 adding a small inverter to each of the first and the second inverters to convert the first and the second inverters to weak data latches.

17. The PLG of claim 11, wherein proper programming of the switches generates 16 logic functions of the two inputs.

18. A method of generating logic functions of two input signals by programming switches, the method comprising:
 connecting a first input and a voltage Vdd to a first node through a first and a second programmable switch, respectively;
 connecting the first node to a first pass gate through a third switch and also through a series combination of a first inverter and a fourth switch;
 connecting the first input and the Vdd to a second node through a fifth and a sixth programmable switch, respectively;
 connecting the second node to a second pass gate through a seventh switch and also through a series combination of a second inverter and an eight switch; and
 controlling the first and the second pass gates by a combination of a second input signal.

19. The method of claim 18, wherein pass gates are implemented by transmission gates, NMOS transistors, or PMOS transistors.

20. The method of claim 18, wherein each switch is an NMOS transistor.

21. The method of claim 18, wherein each switch is an NMOS transistor the gate of which is controlled by a programmable memory cell.

22. The method of claim 18, wherein each switch is a MOS transistor the gate of which is controlled by an XPM (super programmable memory) that comprises a half- and a full-transistor.

23. The method of claim 18, wherein the following additions will prevent leakage when inputs to the first or the second inverter are floating:
 using virtual ground on the inverters by letting an original Vss float or be biased to Vcc;
 turning off power; or
 adding small inverters to convert signal inverters to weak data latches.

24. The method of claim 18, wherein the switches comprise at least four switches that are configurable to generate up to 16 logic functions via the two inputs.

* * * * *